US009123904B2

(12) United States Patent
Lee et al.

(10) Patent No.: US 9,123,904 B2
(45) Date of Patent: Sep. 1, 2015

(54) LIGHT EMITTING DEVICE AND METHOD OF MANUFACTURING THE LIGHT EMITTING DEVICE

(71) Applicant: Samsung Electronics Co., Ltd., Suwon-si, Gyeonggi-Do (KR)

(72) Inventors: Gae-hwang Lee, Seongnam-si (KR); Jeong-woo Park, Chungcheongnam-do (KR); Yoon-young Kwon, Chungcheongnam-do (KR); Kyung-wook Park, Chungcheongnam-do (KR); Mi-jeong Song, Suwon-si (KR); Young-Zo Yoo, Chungcheongnam-do (KR); Yong-wan Jin, Seoul (KR)

(73) Assignees: Samsung Electronics Co., Ltd., Gyeonnggi-Do (KR); Samsung Corning Precision Materials Co., Ltd., Chungcheongnam-Do (KR)

(*) Notice: Subject to any disclaimer, the term of this patent is extended or adjusted under 35 U.S.C. 154(b) by 0 days.

(21) Appl. No.: 14/146,335

(22) Filed: Jan. 2, 2014

(65) Prior Publication Data
US 2014/0191266 A1    Jul. 10, 2014

(30) Foreign Application Priority Data
Jan. 4, 2013    (KR) .................... 10-2013-0001213

(51) Int. Cl.
*H01L 51/52*    (2006.01)
*H01L 51/56*    (2006.01)
*H01L 51/44*    (2006.01)

(52) U.S. Cl.
CPC .......... *H01L 51/442* (2013.01); *H01L 51/5215* (2013.01); *Y02E 10/549* (2013.01)

(58) Field of Classification Search
None
See application file for complete search history.

(56) References Cited

U.S. PATENT DOCUMENTS 7,872,414 B2    1/2011    Sugita et al.
8,427,747 B2    4/2013    Le et al.
(Continued)

FOREIGN PATENT DOCUMENTS

EP    1 471 587 A2    10/2004
KR    2006-0030396 A    4/2006
KR    10-1000120 B1    12/2010

OTHER PUBLICATIONS

Daliento, S.; Guerriero, P.; Addonizio, M.; Antonaia, A.; Gambale, E., "Refractive index measurement in TCO layers for micro optoelectronic devices," Microelectronics Proceedings—MIEL 2014, 2014 29th International Conference on, vol., No., pp. 265,268, May 12-14, 2014.*

(Continued)

*Primary Examiner* — Joseph Schoenholtz
(74) *Attorney, Agent, or Firm* — Harness, Dickey & Pierce (57) ABSTRACT

In one example embodiment, a light emitting device includes a transparent substrate and a transparent electrode on the transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers. The light emitting device further includes a light emission layer on the transparent electrode and a reflective electrode on the light emission layer.

17 Claims, 9 Drawing Sheets

(56) References Cited

U.S. PATENT DOCUMENTS

| | | | |
|---|---|---|---|
| 2006/0097630 A1* | 5/2006 | Shiokawa et al. | 313/504 |
| 2009/0230415 A1* | 9/2009 | Ide et al. | 257/98 |
| 2010/0038669 A1* | 2/2010 | McKenzie | 257/98 |
| 2010/0110551 A1 | 5/2010 | Lamansky et al. | |
| 2011/0163403 A1* | 7/2011 | Bhatia et al. | 257/432 |
| 2012/0152347 A1* | 6/2012 | Lee et al. | 136/256 |
| 2014/0027748 A1* | 1/2014 | Inada et al. | 257/40 |
| 2014/0103314 A1* | 4/2014 | Satoh et al. | 257/40 |
| 2014/0138731 A1* | 5/2014 | Nakamura et al. | 257/98 |

OTHER PUBLICATIONS

Definition of on downloaded from URL http://www.merriam-webster.com/dictionary/on on Jan. 26, 2015.*

Definition of successive downloaded from URL<http://www.merriam-webster.com/dictionary/successive > on Oct. 27, 2014.*

J.M. Macak et al. "TiO2 nanotubes: Self-organized electrochemical formation, properties and applications"; Elsevier Ltd., Current Opinion in Solid State and Materials Science vol. 11, pp. 3-18; 2007.

* cited by examiner

LIGHT EMITTING DEVICE AND METHOD OF MANUFACTURING THE LIGHT EMITTING DEVICE

CROSS-REFERENCE TO RELATED APPLICATIONS

This application claims the benefit of Korean Patent Application No. 10-2013-0001213, filed on Jan. 4, 2013, in the Korean Intellectual Property Office, the disclosure of which is incorporated herein in its entirety by reference.

BACKGROUND

1. Field

The present disclosure relates to a light emitting device and a method of manufacturing the light emitting device, and more particularly, to an organic light emitting device (OLED), which has an improved extraction efficiency by using a transparent electrode composed of two or more layers with different refractive indices, and a method of manufacturing the OLED.

2. Description of the Related Art

An OLED, unlike for example, a light emitting diode (LED) which is a point light source composed of a compound semiconductor material, is capable of performing surface light emission, and has many advantages such as low power consumption, high outdoor visibility, flexibility, and so forth. For this reason, the OLED has attracted much attention from an illumination field as well as a display device field. However, the OLED typically has a low light extraction efficiency such that only about 20% of emitted light is emitted to outside. The low light extraction efficiency mainly originates from a refractive index difference between an organic light emission layer and the external air. That is, only light in a region of a predetermined angle from light generated in an organic light emission layer is emitted to the outside, and light in the other-angle region disappears by being absorbed in the OLED due to total reflection occurring in an interface with the air.

To improve the light extraction efficiency of the OLED, light extraction layers having various structures have been used. For example, a light extraction layer in a micro-lens array form may be attached onto an external surface of a substrate. However, the external light extraction layer formed on the external surface of the substrate does not prevent light loss occurring between layers in the OLED, thus having a limitation in efficiency improvement.

Therefore, various structures for implementing the light extraction layer in the OLED have been proposed. For example, such an internal light extraction layer is generally disposed between a substrate and a transparent electrode. The internal light extraction layer typically includes unevenness or a scatterer, which may degrade surface flatness of a transparent electrode. If the surface flatness of the transparent electrode degrades, electric charges such as holes and electrons are concentrated onto a particular region, degrading electric characteristics of the OLED.

SUMMARY

Some example embodiments include a light emitting device having an improved light extraction efficiency by using a transparent electrode having two or more layers, and a method of manufacturing the light emitting device.

Additional aspects will be set forth in part in the description which follows and, in part, will be apparent from the description, or may be learned by practice of the presented embodiments.

In one example embodiment, a light emitting device includes a transparent substrate and a transparent electrode on the transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers. The light emitting device further includes a light emission layer on the transparent electrode and a reflective electrode on the light emission layer.

In yet another example embodiment, a difference between the refractive indices of the transparent electrode layers is in a range of 0.1 through 1.0.

In yet another example embodiment, the at least two transparent electrode layers be formed of a transparent conductive material comprising at least one of tin-doped indium oxide (ITO), zinc-doped indium oxide (IZO), aluminum-doped zinc oxide (AZO) and gallium-doped zinc oxide (GZO).

In yet another example embodiment, the at least two transparent electrode layers include a first transparent layer formed on the transparent substrate and a second transparent electrode layer formed on the first transparent layer.

In yet another example embodiment, the first transparent electrode layer is formed of gallium-doped zinc oxide (GZO), and the second transparent electrode layer is formed of tin-doped indium oxide (ITO).

In yet another example embodiment, a thickness of the first transparent electrode layer is in a range of 50 nm through 500 nm, and a thickness of the second transparent electrode layer is in a range of 200 nm through 2 μm.

In yet another example embodiment, the light emitting device further include multiple nano voids formed on an upper surface of the first transparent electrode layer.

In yet another example embodiment, a size of the multiple nano voids is in a range of 5 nm through 1 μm, and a height of the multiple nano voids is in a range of 5 nm through 10 μm.

In yet another example embodiment, the multiple nano voids be filled with air or a transparent dielectric.

In yet another example embodiment, the transparent electrode further includes a third transparent electrode layer disposed on the second transparent electrode layer, wherein a refractive index of the first transparent electrode layer may be higher than a refractive index of the second transparent electrode layer, and the refractive index of the second transparent electrode layer may be higher than a refractive index of the third transparent electrode layer.

In yet another example embodiment, the light emitting device further includes multiple nano voids formed on at least one of an upper surface of the first transparent electrode layer and an upper surface of the second transparent electrode layer.

In one example embodiment, a method of manufacturing a light emitting device includes forming a transparent electrode on a transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers. The method further includes forming a light emission layer on the transparent electrode and forming a reflective electrode on the light emission layer.

In yet another example embodiment, the forming of the transparent electrode includes forming a first transparent electrode layer on the transparent substrate. The forming of the transparent electrode further includes forming multiple nano voids on an upper surface of the first transparent electrode layer by using an anodizing scheme. The forming of the transparent electrode further includes forming a second transparent electrode layer on the first transparent electrode layer, wherein a refractive index of the first transparent electrode layer is higher than a refractive index of the second transparent electrode layer In yet another example embodiment, a difference between the refractive indices of the first transparent electrode layer and the second transparent electrode layer is in a range of 0.1 through 1.0.

In yet another example embodiment, the first transparent electrode layer and the second transparent electrode layer are formed of a transparent conductive material including at least one of tin-doped indium oxide (ITO), zinc-doped indium oxide (IZO), aluminum-doped zinc oxide (AZO) and gallium-doped zinc oxide (GZO).

In yet another example embodiment, the forming multiple nano voids on the upper surface of the first transparent electrode layer by using the anodizing scheme includes attaching the transparent substrate on which the first transparent electrode layer is formed onto an anode, dipping a cathode and the anode into a solution, and applying at least one of a direct current and a pulse current to the cathode and the anode.

In yet another example embodiment, the solution is a neutral solution including a halogen component.

In yet another example embodiment, the solution includes at least one of C16H36NClO4, NaF and NH4F.

In yet another example embodiment, the forming of the transparent electrode further includes forming a third transparent electrode layer on the second transparent electrode layer, wherein the first transparent electrode layer is formed on the transparent substrate and the second transparent electrode is formed on the first transparent electrode layer, and a refractive index of the second transparent electrode layer is higher than a refractive index of the third transparent electrode layer.

In yet another example embodiment, the forming of the transparent electrode includes forming multiple nano voids on an upper surface of the second transparent electrode layer by using an anodizing scheme.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the present disclosure and wherein.

DETAILED DESCRIPTION

Various embodiments will now be described more fully with reference to the accompanying drawings. Like elements on the drawings are labeled by like reference numerals.

Detailed illustrative embodiments are disclosed herein. However, specific structural and functional details disclosed herein are merely representative for purposes of describing example embodiments. This disclosure may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected,' or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs), computers or the like.

Figure 1:
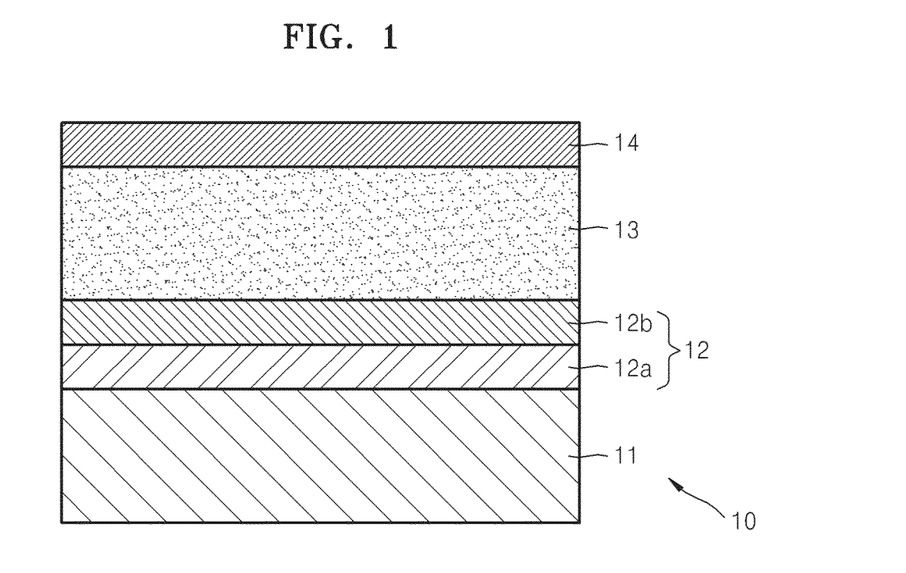
FIG. 1 is a cross-sectional view schematically showing an example structure of a light emitting device according to an example embodiment.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function. First, FIG. 1 is a cross-sectional view schematically showing an example structure of a light emitting device 10 according to an example embodiment. Referring to FIG. 1, the light emitting device 10 may include a transparent substrate 11, a transparent electrode 12 disposed on the transparent substrate 11, a light emission layer 13 disposed on the transparent electrode 12, and a reflective electrode 14 disposed on the light emission layer 13.

The transparent substrate 11 may be formed of, for example, a transparent glass or plastic material. The transparent electrode 12 on the transparent substrate 11 may have a multi-layer structure in which two transparent electrode layers 12a and 12b are sequentially stacked. For example, a first transparent electrode layer 12a is formed on the transparent substrate 11, and a second transparent electrode layer 12b may be stacked in succession on the first transparent electrode layer 12a. A light emission layer 13 may be disposed on the second transparent electrode layer 12b.

The light emission layer 13 may be formed of, for example, an organic light emitting material. Furthermore, an inorganic light emitting material including, but not limited to, a quantum dot and other light emitting materials may be used for the light emission layer 13 as well. Although not shown in the drawings, a hole injection layer and a hole transport layer may be further interposed between the transparent electrode 12 and the light emission layer 13. An electron injection layer and an electron transport layer may be further interposed between the reflective electrode 14 and the light emission layer 13, if the transparent electrode 12 is an anode and the reflective electrode 14 is a cathode. If the transparent electrode 12 is a cathode and the reflective electrode 14 is an anode, the electron injection layer and the electron transport layer may be further interposed between the transparent electrode 12 and the light emission layer 13 and the hole injection layer and the hole transport layer may be further interposed between the reflective electrode 14 and the light emission layer 13. The reflective electrode 14 may be formed of a conductive metallic material having good reflectivity including, but not limited to, as gold (Au), silver (Ag), aluminum (Al), or the like.

In one example embodiment, the light emitting device 10 does not include a separate light extraction layer for emitting light generated in the light emission layer 13 to outside, and the transparent electrode 12 may also serve as the light extraction layer. Accordingly, the first transparent electrode layer 12a and the second transparent electrode layer 12b of the transparent electrode 12 may be formed of materials having different refractive indices. Herein, the refractive index of the first transparent electrode layer 12a near the transparent substrate 11 may be higher than that of the second transparent electrode layer 12b close to the light emission layer 13. In this case, in a region of the transparent electrode 12 between the light emission layer 13 and the transparent substrate 11, a refractive index gradient exists in which a refractive index gradually increases in a direction from the light emission layer 13 toward the transparent substrate 11. Thus, during emission of the light generated in the light emission layer 13 to outside through the transparent substrate 11, loss of the light caused by total reflection may be reduced. For example, a refractive index difference between the first transparent electrode layer 12a and the second transparent electrode layer 12b may be about 0.1 through 1.0.

The material of the transparent electrode 12 may be any one of, but not limited to, a transparent conductive oxide such as tin-doped indium oxide (ITO), a zinc-doped indium oxide (IZO), an aluminum-doped zinc oxide (AZO), a gallium-doped zinc oxide (GZO), etc. For example, GZO with a refractive index of about 2.0 may be used as a material of the first transparent electrode layer 12a and ITO with a refractive index of about 1.8 may be used as a material of the second transparent electrode layer 12b. Considering the light transmittance and surface resistance, the first transparent electrode layer 12a formed of a transparent conductive oxide may have a thickness of about 50 nm through about 500 nm. In one example embodiment, the first transparent electrode layer 12a formed of a transparent conductive oxide has a thickness of about 100 nm through about 150 nm. The second transparent electrode layer 12b formed of a transparent conductive oxide may have a thickness of about 200 nm through 2 μm. In one example embodiment, the second transparent electrode layer 12b formed of a transparent conductive oxide has a thickness of about 500 nm through 700 nm. In addition to the transparent conductive oxide, graphene may also be used, or a metallic material may be coated to a very thin thickness to allow transmission of light for use as the transparent electrode 12. Any transparent and/or conductive material may be used as the transparent electrode 12. In one example embodiment, the first transparent electrode layer 12a may be formed of a material suitable for forming nano-voids, as will be described below.

Figure 2:
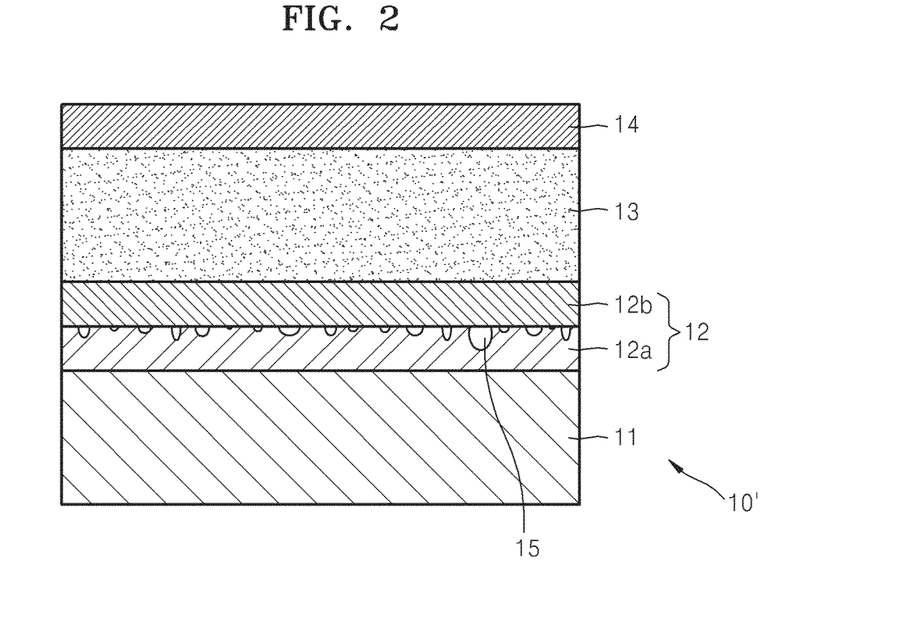
FIG. 2 is a cross-sectional view schematically showing an example structure of a light emitting device according to an example embodiment.

FIG. 2 is a cross-sectional view schematically showing an example structure of a light emitting device 10' according to an example embodiment. The light emitting device 10' shown in FIG. 2 has the same structure as the light emitting device 10 shown in FIG. 1, except that multiple nano-scale voids (hereinafter, nano voids for short) 15 are formed on an upper surface of the first transparent electrode layer 12a.

The multiple nano voids 15 may be empty spaces simply filled with the air, or a transparent dielectric material having a refractive index different from those of the first transparent electrode layer 12a and the second transparent electrode layer 12b may be filled in the empty spaces of the nano voids 15. Nano voids 15 may refract light like a scatterer in a conventional light extraction layer. Thus, the traveling angle of light which travels in a range of an angle totally reflected by the transparent substrate 11 may be changed by the nano voids 15. For example, the traveling angle of light which travels at a high angle from a normal line of the upper surface of the transparent substrate 11 may be changed to an angle which is close to the normal line of the upper surface of the transparent substrate 11 due to the nano voids 15. By forming the nano voids 15 on the upper surface of the first transparent electrode layer 12a, the light extraction efficiency of the light emitting device 10' may be further improved.

In one example embodiment, the shapes and sizes of the multiple nano voids 15 are not necessarily fixed, and the multiple nano voids 15 having various sizes and shapes may be irregularly formed on the upper surface of the first transparent electrode layer 12a. For example, the nano voids 15 may have various shapes including, but not limited to, a spherical shape, a hemispherical shape, an oval shape, and a hollow bar shape. In addition, the size of the nano void 15 (for example, a diameter or width) may be in a range of about 5 nm through about 1 μm and the height (or a depth from the surface of the first transparent electrode layer 12a) of the nano void 15 may be in a range of about 5 nm through about 10 μm.

Figure 3:
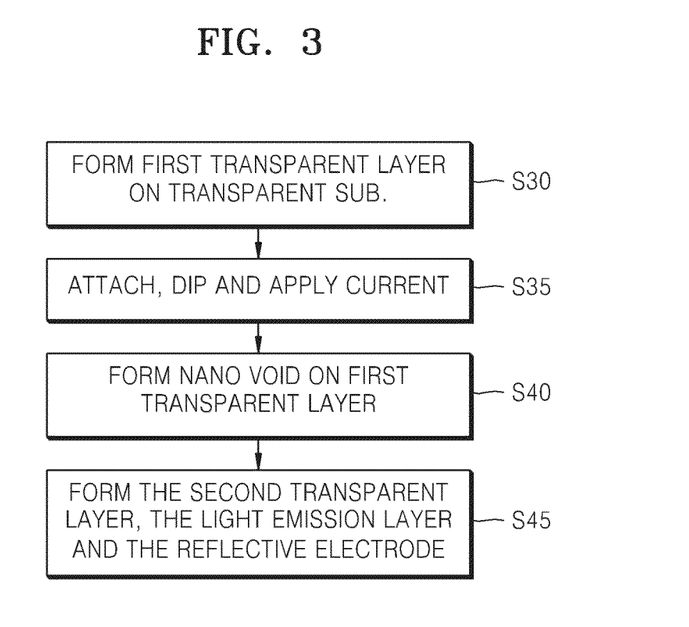
FIG. 3 describes a method for manufacturing a light emitting device, according to an example embodiment.

The nano voids 15 may be formed by, for example, performing surface treatment, such as an anodizing scheme, on the upper surface of the first transparent electrode layer 12a. Hereinafter, a method for manufacturing a light emitting device such as the light emitting device 10' will be described, with reference to FIG. 3. FIG. 3 describes a method for manufacturing a light emitting device, according to an example embodiment.

At S30, the first transparent layer 12a is formed (e.g., grown) on the transparent substrate 11, which as mentioned above may be a plate made of a transparent glass or plastic material. The first transparent layer 12a may be made of gallium-doped zinc oxide (GZO) as the first transparent electrode layer grown on the transparent substrate 11 by using atmosphere pressure chemical vapor deposition (APCVD). In one example embodiment, if GZO is grown to a thickness of about 400 nm, the first transparent electrode layer 12a formed of GZO has a surface resistance of about 4 through about 5 ohm/sq and the upper surface is formed relatively rough. Herein, APCVD is presented as an example method and the first transparent electrode layer 12a may also be formed on the transparent substrate 11 by using chemical vapor deposition (CVD) or physical vapor deposition (PVD).

At S35, the transparent substrate 11 on which the first transparent electrode layer 12a is grown may be attached to an anode. Still at S85, a cathode and the anode are dipped into a solution, and direct current is applied to the cathode and the anode. The anode and the cathode are described below. The solution may be any one of, but not limited to, a neutral solution including a halogen component such as chlorine (Cl) or fluorine (F), a solution including tetrabutylammonium perchlorate ($C_{16}H_{36}ClNO_4$), NaF or $NH_4F$, etc. In one example embodiment, $C_{16}H_{36}ClNO_4$ of 1.71 g is melted in an acetonitrile solution of 0.1 L and then the transparent substrate 11 (e.g., a glass plate) on which GZO is grown, a cathode, and a reference electrode are dipped into the solution. GZO is used as an anode, Platinum (Pt) is used as the cathode, and Ag/AgCl is used as the reference electrode.

The current may be applied continuously or in a form of a pulse. In one example embodiment, a pulse having a current density of about 1 $A/cm^2$ and a pulse interval of about 0.01 second and pulse current having a current density of about 0 $A/cm^2$ and a pulse interval of about 0.03 second are applied to the anode and the cathode three times, such that as shown in FIG. 3, the multiple nano voids 15 are formed on the upper surface of the first transparent electrode layer 12a. The above-described experimental example is not intended to limit the present disclosure, and it should be noted that the example is one of various examples for forming the nano voids 15 on the first transparent electrode layer 12a.

At S40, multiple nano voids 15 are formed on the upper surface of the first transparent electrode layer 12a. For example, metallic ions on the upper surface of the first transparent electrode layer 12a are coupled with halogen ions, such that the upper surface of the first transparent electrode layer 12a is partially corroded, forming the multiple nano voids 15 on the upper surface of the first transparent electrode layer 12a.

Figure 4:
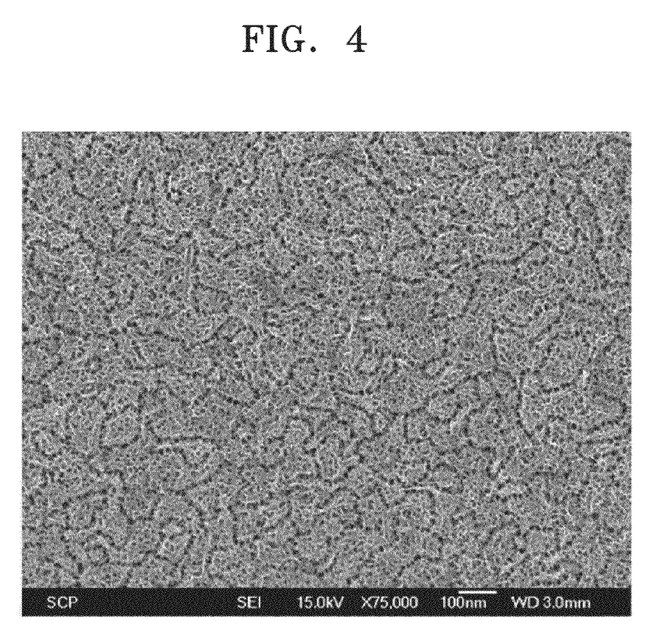
FIG. 4 is an electronic microscope picture showing nano voids formed on an upper surface of a first transparent electrode layer shown in FIG. 2, according to an example embodiment.

FIG. 4 is an electronic microscope picture showing the multiple nano voids 15 formed on the upper surface of the first transparent electrode layer 12a shown in FIG. 2, according to an example embodiment.

Referring to FIG. 4, it can be seen that the multiple nano voids 15 may be irregularly formed on the upper surface of the first transparent electrode layer 12a. The Cl ions partially strip off Ga and Zn metal from the surface of the first transparent electrode layer 12a, thus generating the nano voids 15. As shown in FIG. 3, it can be seen that the nano voids 15 may be formed with high density mainly around a grain boundary of the first transparent electrode layer 12a.

After the multiple nano voids 15 are formed on the first transparent electrode layer 12a, at S45, the second transparent electrode layer 12b, the light emission layer 13, and the reflective electrode 14 may be sequentially formed according to a general method of manufacturing the light emitting device 10'. Since the size of the nano voids 15 is very small, even if the second transparent electrode layer 12b is formed on the first transparent electrode 12a after formation of the multiple nano voids 15, the nano voids 15 are not filled by the second transparent electrode layer 12b. Thus, even after the second transparent electrode layer 12b is formed, the nano voids 15 may be maintained without disappearing. Moreover, because the sizes of the nano voids 15 are very small, the flatness of the upper surface of the second transparent electrode layer 12b is hardly affected by the nano voids 15. Therefore, the light emitting device 10' is easy to manufacture on a large scale as compared to a conventional light emitting device including a light extraction layer where multiple scatterers are dispersed. Furthermore, in order to improve the flatness of the transparent electrode, a separate planarizing layer is not necessary.

Figure 5:
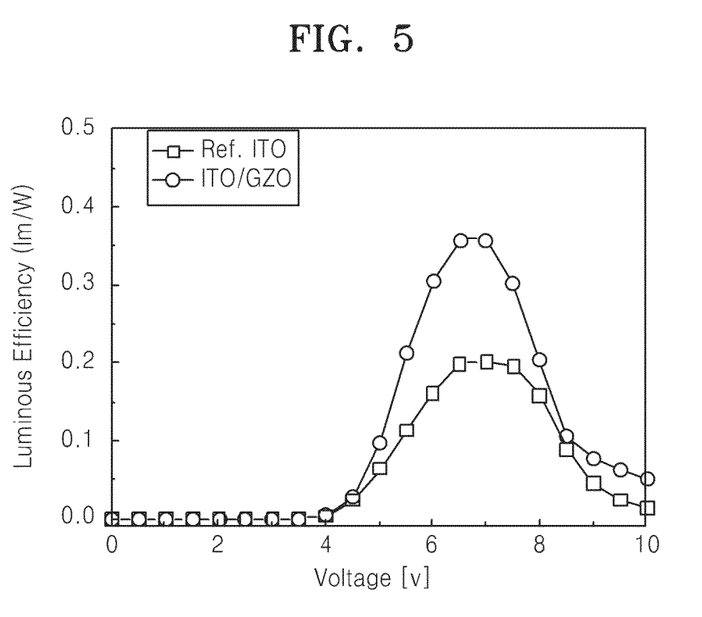
FIGS. 5 and 6 are graphs showing the light emission efficiency of a light emitting device including a first transparent electrode layer shown in FIG. 4, according to an example embodiment.
Figure 6:
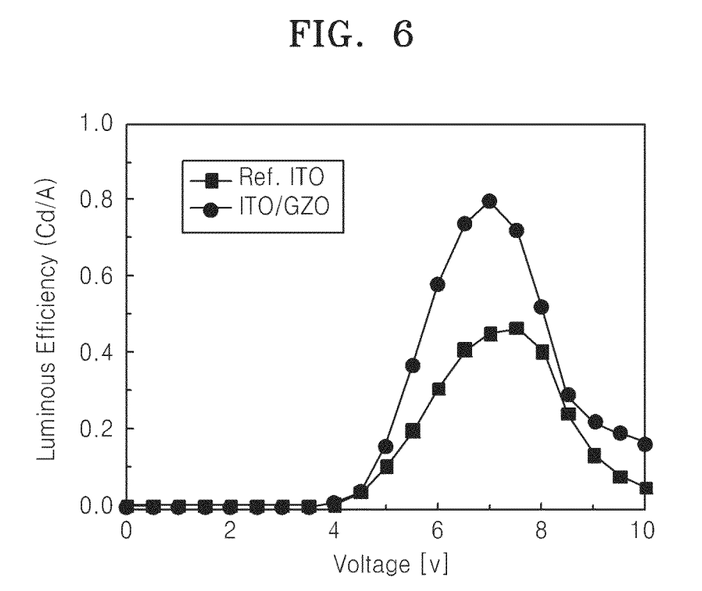
Figure 7:
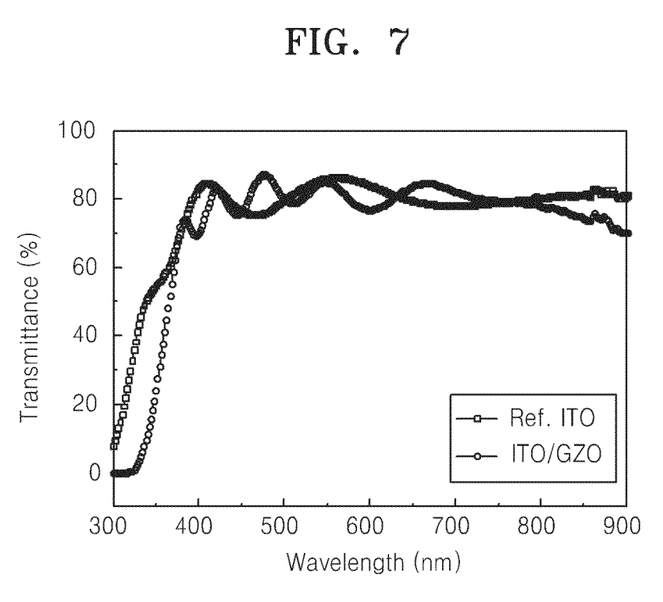
FIG. 7 is a graph showing a transmittance of a transparent electrode including a first transparent electrode layer shown in FIG. 4, according to an example embodiment.

Moreover, although the multiple nano voids 15 are formed, the transmittance of the first transparent electrode layer 12a is not largely changed as compared to when no nano voids 15 are present. Furthermore, the light extraction efficiency of the light emitting device 10' may be further improved because the nano voids 15 refract and scatter the light. For example, FIGS. 5 and 6 are graphs showing the light emission efficiency of the light emitting device 10' including the first transparent electrode layer 12a shown in FIG. 4, according to an example embodiment. FIG. 7 is a graph showing the transmittance of the transparent electrode 12 including the first transparent electrode layer 12a shown in FIG. 4, according to an example embodiment.

The light emitting device 10' used in the graphs of FIGS. 5 and 6 are manufactured as described below. That is, as the second transparent electrode layer 12b, ITO is deposited to a thickness of about 300 nm on the first transparent electrode layer 12a, and as a hole transport layer (HTL), poly(3,4-ethylenedioxythiophene):poly(styrenesulfonate) (PEDOT:PSS) is spin-coated to a thickness of about 30 nm on the ITO. The light emission layer 13 is formed by spin-coating poly [(9,9-di-n-octylfluorenyl-2,7-diyl)-alt(benzo[2,1,3]thiadiazol-4,8-diyl)] (F8BT) dissolved in chlorobenzene to a thickness of about 80 nm, and as a reflective electrode (cathode), Ca/Al (20 nm/80 nm) is deposited on the light emission layer 13. In addition, a light emission structure which is the same as the foregoing structure except for absence of the first transparent electrode layer 12a is manufactured as a comparison target.

Referring to the graph of FIG. 5 showing light emission efficiency with intensity of light per unit power (lm/W), the comparison target has about 0.199 lm/W at 6.5V, whereas the light emitting device 10' according to an example embodiment has about 0.359 lm/W at 6.5V, such that the light emitting device 10' has a light extraction efficiency which is about 1.8 times that of the comparison target. In addition, referring to the graph of FIG. 6 showing light emission efficiency with luminance per unit current (Cd/A), the comparison target has about 0.453 Cd/A at 7.0V, whereas the light emitting device 10' according to an example embodiment has about 0.8 Cd/A at 7.0V, such that the light emitting device 10' has a light extraction efficiency which is about 1.76 times that of the comparison target.

FIG. 7 is a graph showing a transmittance of a transparent electrode including a first transparent electrode layer shown in FIG. 4, according to an example embodiment. The transmittance graph of FIG. 7 compares the transmittance of the transparent electrode 12 with the transmittance of ITO having a thickness of 300 nm. Herein, as the second transparent electrode layer 12b, ITO having a thickness of about 300 nm is deposited on the first transparent electrode layer 12a shown in FIG. 3. As shown in FIG. 7, it can be seen that there is not large difference in transmittance in a visible light area. For example, in a wavelength range of 500 nm through 600 nm, the ITO electrode has a transmittance of about 79% through about 86%, and the ITO/GZO electrode according to an example embodiment has a transmittance of about 76% through about 85%.

In addition, according to one example embodiment, the surface resistance of the transparent electrode 12 is also reduced. For example, the surface resistance of the transparent electrode 12 according to an example embodiment in which as the second transparent electrode layer 12b, ITO having a thickness of about 300 nm is deposited on the first transparent electrode layer 12a shown in FIG. 3 is about 4.62Ω/cm$^2$, whereas the surface resistance of the transparent electrode including ITO having a thickness of about 300 nm is about 14.66Ω/cm$^2$, such that the surface resistance of the transparent electrode 12 according to an example embodiment is about ⅓ of that of the conventional transparent electrode. Therefore, according to an example embodiment, the light emitting device 10' may be improved in terms of power consumption as well as light extraction efficiency.

Although the transparent electrode 12 is illustrated as including two transparent electrode layers 12a and 12b in FIGS. 1 and 2, it may be formed to have a multi-layer structure including three or more layers. For example, FIG. 8 is a cross-sectional view schematically showing an example structure of a light emitting device according to an example embodiment.

Figure 8:
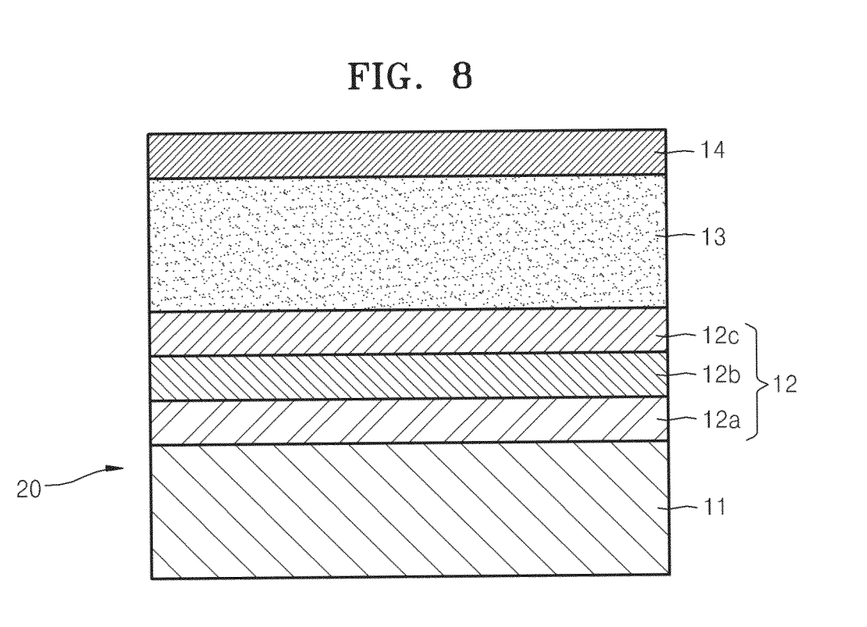
FIG. 8 is a cross-sectional view schematically showing an example structure of a light emitting device according to an example embodiment.

Referring to FIG. 8, a light emitting device 20 according to an example embodiment may include a transparent substrate 11, a transparent electrode 12 disposed on the transparent substrate 11, a light emission layer 13 disposed on the transparent electrode 12, and a reflective electrode 14 disposed on the light emission layer 13. Herein, the transparent electrode 12 may have a multi-layer structure in which three transparent electrode layers 12a, 12b, and 12c are stacked in succession. For example, the first transparent electrode layer 12a, the second transparent electrode layer 12b, and the third transparent electrode layer 12c may be successively stacked on the transparent substrate 11. As in the embodiment shown in FIG. 1, the first through third transparent electrode layers 12a through 12c may have different refractive indices. In particular, the closer to the transparent substrate 11 the transparent electrode layer is, the higher the refractive index is. That is, the refractive index of the first transparent electrode layer 12a may be higher than that of the second transparent electrode layer 12b, and the refractive index of the second transparent electrode layer 12b may be higher than that of the third transparent electrode layer 12c.

Figure 9:
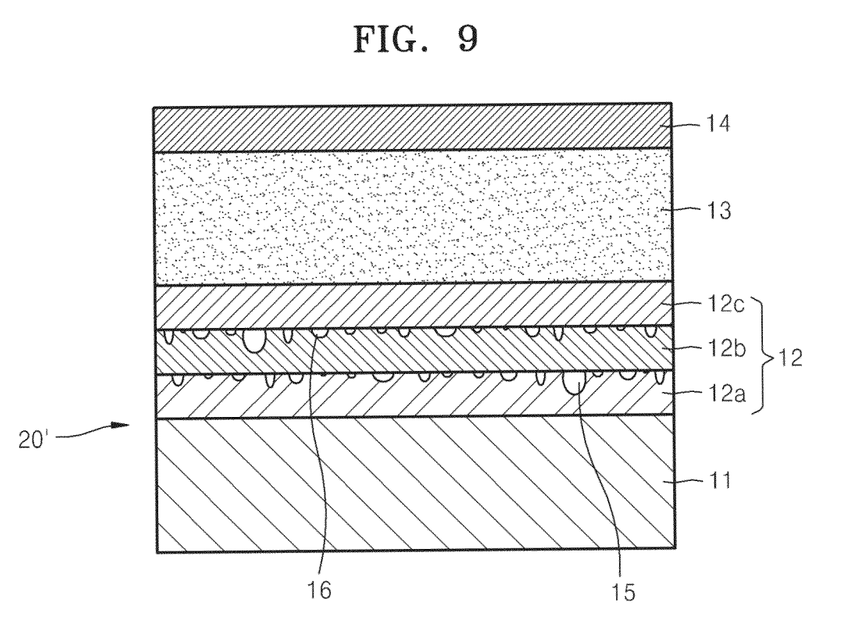
FIG. 9 is a cross-sectional view schematically showing an example structure of a light emitting device according to an example embodiment.

Moreover, the multiple nano voids 15 described in FIG. 2 may also be applied to the embodiment shown in FIG. 8. For example, referring to FIG. 9 which illustrates an example structure of a light emitting device 20' according to an example embodiment of the present disclosure, the multiple nano voids 15 may be formed on the upper surface of the first transparent electrode layer 12a, and multiple nano voids 16 may be formed on the upper surface of the second transparent electrode layer 12b. However, no nano void may be formed on the upper surface of the third transparent electrode layer 12c. Although the nano voids 15 and 16 are illustrated as being formed on both the upper surface of the first transparent electrode layer 12a and the upper surface of the second transparent electrode layer 12b in FIG. 9, they may be formed on either the upper surface of the first transparent electrode layer 12a or the upper surface of the second transparent electrode layer 12b.

By using a direct current instead of a pulse current, the multiple nano voids 15 are formed on an upper surface of the first transparent electrode layer 12a. For example, GZO is used as the first transparent electrode layer 12a, and the upper surface of the first transparent electrode layer 12a is electrochemically treated in an anodizing scheme using a direct current. Herein, 0.5 wt % of NH$_4$F is mixed into an ethylene glycol solution as a solution for electro-chemical treatment, and an applied voltage and an applied current are 20V and 0.7 A, respectively, with a treatment time of 100 seconds. Thereafter, indium oxide (IZO) doped with about 10 wt % of Zinc is deposited on the first transparent electrode layer 12a to a thickness of about 200 nm using a sputtering method to form the second transparent electrode layer 12b, thereby manufacturing the transparent electrode 12 having the multi-layer structure.

Figure 10A:
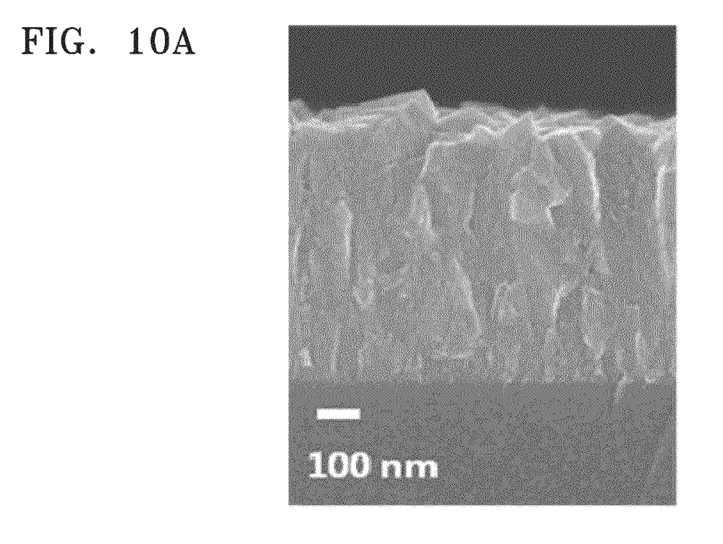
FIG. 10A is a side picture of a first transparent electrode layer whose surface is not electro-chemically treated.
Figure 10B:
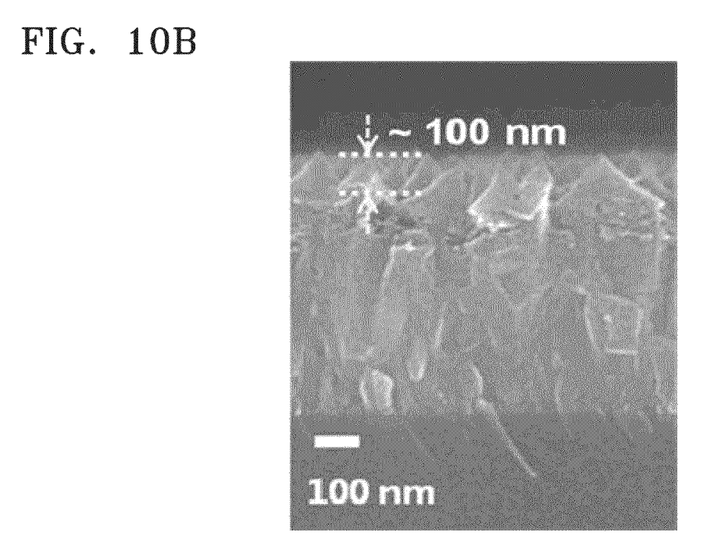
FIG. 10B is a side picture of a first transparent electrode layer whose surface is electro-chemically treated by an anodizing scheme using a direct current.

FIG. 10A is a side picture of the first transparent electrode layer 12a whose surface is not electro-chemically treated, and FIG. 10B is a side picture of the first transparent electrode layer 12a whose surface is electro-chemically treated by an anodizing scheme using a direct current. As shown in FIG. 10B, the surface structure of the first transparent electrode layer 12a changes to a depth of about 100 nm, and a grain boundary of the first transparent electrode layer 12a is corroded such that multiple surface irregularities in the form of a trigonal pyramid are generated.

Figure 11:
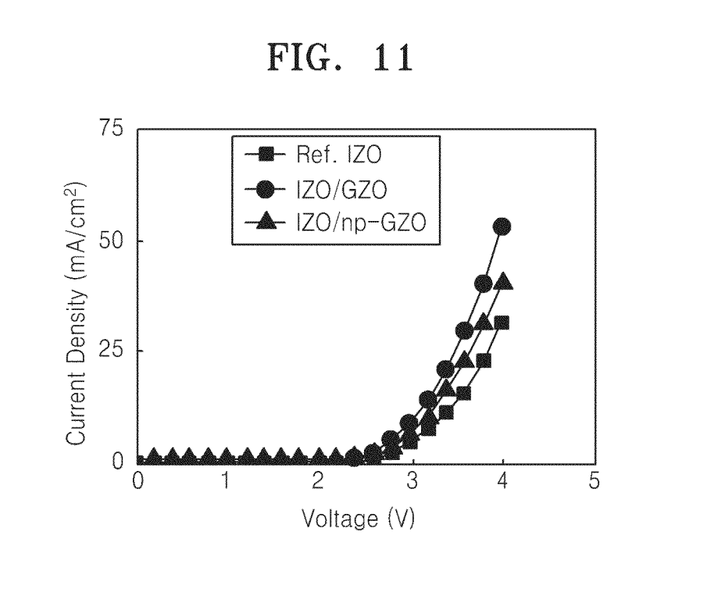
FIG. 11 is a graph showing a change in current density with respect to voltage of an organic light emitting device (OLED) including a first transparent electrode layer illustrated in FIGS. 10A and 10B.
Figure 12:
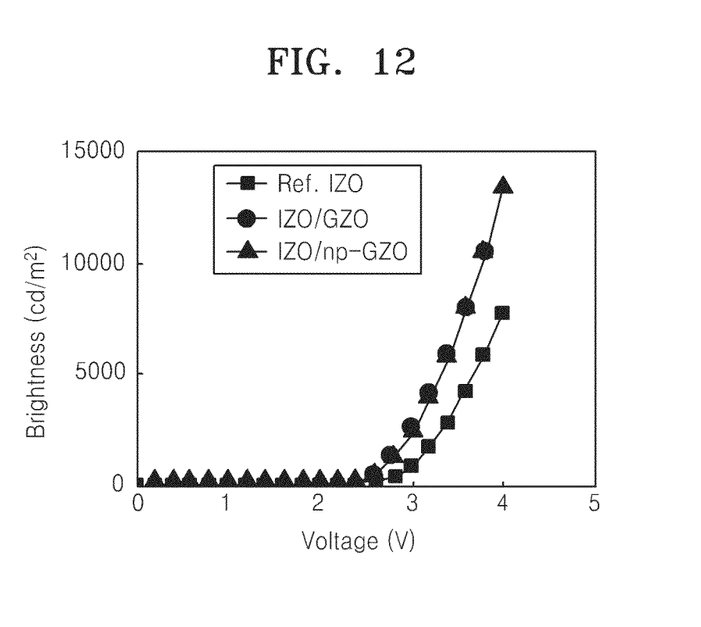
FIG. 12 is a graph showing a change in luminance with respect to voltage of an OLED including a first transparent electrode layer illustrated in FIGS. 10A and 10B.
Figure 13:
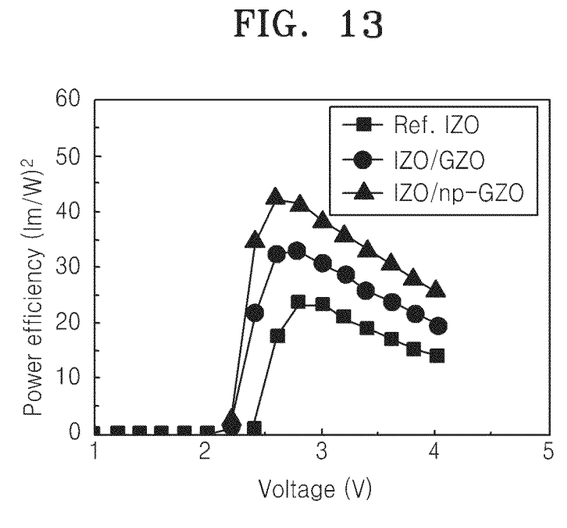
FIG. 13 is a graph showing a change in efficiency with respect to voltage of an OLED including a first transparent electrode layer illustrated in FIGS. 10A and 10B.

By manufacturing the OLED based on a green fluorescent material using the multi-layer transparent electrode 12 formed in the foregoing manner, results shown in FIGS. 11 to 13 are obtained. FIG. 11 is a graph showing a change in current density with respect to voltage, FIG. 12 is a graph showing a change in luminance with respect to voltage, and FIG. 13 is a graph showing a change in efficiency with respect to voltage. In FIGS. 11 to 13, a square indicates an OLED (Comparative Example) using a single-layer transparent electrode formed of IZO, a circle indicates an OLED (Embodiment 1) using a multi-layer transparent electrode in which IZO is deposited on non-surface-treated GZO (shown in FIG. 10A), a triangle indicates an OLED (Embodiment 2) using a multi-layer transparent electrode in which IZO is deposited on electro-chemical-surface-treated GZO (shown in FIG. 10B). As can be seen from the graphs shown in FIGS. 11 to 13, current density is highest (that is, sheet resistance is lowest) for Embodiment 1 and current density is lowest for Comparative Example. The luminance of Embodiment 1 and the luminance of Embodiment 2 are improved when compared to Comparative Example and the efficiency of Embodiment 2 is significantly improved when compared to Comparative Example.

So far, embodiments of a light emitting device and a method of manufacturing the light emitting device have been described and illustrated in the accompanying drawings. However, these embodiments are merely intended to illustrate the present disclosure, rather than to limit the present disclosure. Moreover, it should be understood that the present disclosure is not limited to the illustrated and described description. This is because various modifications may be made by those of ordinary skill in the art.

What is claimed is:

1. A light emitting device comprising:
a transparent substrate;
a transparent electrode on the transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers, the transparent electrode including a first transparent electrode layer on the transparent substrate and a second transparent electrode layer on the first transparent electrode layer;
a light emission layer on the transparent electrode;
a reflective electrode on the light emission layer; and
multiple nano voids formed on an upper surface of the first transparent electrode layer.

2. The light emitting device of claim 1, wherein a difference between the refractive indices of the transparent electrode layers is in a range of 0.1 through 1.0.

3. The light emitting device of claim 1, wherein the at least two transparent electrode layers are formed of a transparent conductive material comprising at least one of tin-doped indium oxide (ITO), zinc-doped indium oxide (IZO), aluminum-doped zinc oxide (AZO) and gallium-doped zinc oxide (GZO).

4. The light emitting device of claim 1, wherein the first transparent electrode layer is formed of gallium-doped zinc oxide (GZO), and the second transparent electrode layer is formed of tin-doped indium oxide (ITO).

5. A light emitting device comprising:
a transparent substrate;
a transparent electrode on the transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers, the transparent electrode including a first transparent electrode layer on the transparent substrate and a second transparent electrode layer on the first transparent electrode layer;
a light emission layer on the transparent electrode; and
a reflective electrode on the light emission layer;
wherein a thickness of the first transparent electrode layer is in a range of 50 nm through 500 nm, and a thickness of the second transparent electrode layer is in a range of 200 nm through 2 µm.

6. The light emitting device of claim 1, wherein a size of the multiple nano voids is in a range of 5 nm through 1 µm, and a height of the multiple nano voids is in a range of 5 nm through 10 µm.

7. The light emitting device of claim 1, wherein the multiple nano voids are filled with at least one of air and a transparent dielectric.

8. A light emitting device comprising:
a transparent substrate;
a transparent electrode on the transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers, the transparent electrode including a first transparent electrode layer on the transparent substrate and a second transparent electrode layer on the first transparent electrode layer;
a light emission layer on the transparent electrode; and
a reflective electrode on the light emission layer;
wherein the transparent electrode further comprises:
a third transparent electrode layer on the second transparent electrode layer, wherein
a refractive index of the first transparent electrode layer is higher than a refractive index of the second transparent electrode layer, and the refractive index of the second transparent electrode layer is higher than a refractive index of the third transparent electrode layer.

9. The light emitting device of claim 8, further comprising multiple nano voids formed on at least one of an upper surface of the first transparent electrode layer and an upper surface of the second transparent electrode layer.

10. A method of manufacturing a light emitting device, the method comprising:
- forming a transparent electrode on a transparent substrate, the transparent electrode comprising at least two transparent electrode layers, the at least two transparent electrode layers being successively stacked and having different refractive indices, the refractive index of one of the at least two transparent electrode layers that is closer to the transparent substrate being higher than the refractive index of the other one of the at least two transparent electrode layers;
- forming a light emission layer on the transparent electrode; and
- forming a reflective electrode on the light emission layer;
- wherein the forming of the transparent electrode comprises:
- forming a first transparent electrode layer on the transparent substrate;
- forming multiple nano voids on an upper surface of the first transparent electrode layer by using an anodizing scheme; and
- forming a second transparent electrode layer on the first transparent electrode layer,
- wherein a refractive index of the first transparent electrode layer is higher than a refractive index of the second transparent electrode layer.

11. The method of claim 10, wherein a difference between the refractive indices of the first transparent electrode layer and the second transparent electrode layer is in a range of 0.1 through 1.0.

12. The method of claim 10, wherein the first transparent electrode layer and the second transparent electrode layer are formed of a transparent conductive material comprising at least one of tin-doped indium oxide (ITO), zinc-doped indium oxide (IZO), aluminum-doped zinc oxide (AZO) and gallium-doped zinc oxide (GZO).

13. The method of claim 10, wherein the forming of the multiple nano voids on the upper surface of the first transparent electrode layer by using the anodizing scheme comprises:
- attaching the transparent substrate on which the first transparent electrode layer is formed onto an anode;
- dipping a cathode and the anode into a solution; and
- applying at least one of a direct current and a pulse current to the cathode and the anode.

14. The method of claim 13, wherein the solution is a neutral solution comprising a halogen component.

15. The method of claim 13, wherein the solution comprises at least one of $C_{16}H_{36}NClO_4$, NaF, and $NH_4F$.

16. The method of claim 10, wherein the forming of the transparent electrode further comprises:
- forming a third transparent electrode layer on the second transparent electrode layer, wherein
- the first transparent electrode layer is formed on the transparent substrate and the second transparent electrode is formed on the first transparent electrode layer, and
- a refractive index of the second transparent electrode layer is higher than a refractive index of the third transparent electrode layer.

17. The method of claim 16, wherein the forming of the transparent electrode further comprises:
- forming multiple nano voids on an upper surface of the second transparent electrode layer by using an anodizing scheme.

* * * * *